United States Patent
Isa et al.

(10) Patent No.: US 7,569,428 B2
(45) Date of Patent: Aug. 4, 2009

(54) METHOD FOR MANUFACTURING SEMICONDUCTOR DEVICE, SEMICONDUCTOR DEVICE AND APPARATUS COMPRISING SAME

(75) Inventors: Satoshi Isa, Tokyo (JP); Satoshi Itaya, Tokyo (JP); Mitsuaki Katagiri, Tokyo (JP); Fumiyuki Osanai, Tokyo (JP); Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 487 days.

(21) Appl. No.: 11/525,952

(22) Filed: Sep. 25, 2006

(65) Prior Publication Data

US 2007/0069362 A1 Mar. 29, 2007

(30) Foreign Application Priority Data

Sep. 28, 2005 (JP) .............................. 2005-283020

(51) Int. Cl.
*H01L 21/82* (2006.01)
*H01L 23/52* (2006.01)

(52) U.S. Cl. .................. 438/129; 257/207; 257/691; 257/E23.024; 361/777

(58) Field of Classification Search .................. 438/129; 257/207, 208, 691, 786, E21.51, E21.512, 257/E23.024; 361/777, 761, 767
See application file for complete search history.

(56) References Cited

U.S. PATENT DOCUMENTS 5,497,030 A 3/1996 Takeuchi

| | | | |
|---|---|---|---|
| 6,198,635 B1 * | 3/2001 | Shenoy et al. | ............... 361/760 |
| 6,211,576 B1 * | 4/2001 | Shimizu et al. | ............. 257/786 |
| 6,410,990 B2 * | 6/2002 | Taylor et al. | ................. 257/786 |
| 7,002,242 B2 * | 2/2006 | Song | ......................... 257/691 |
| 2001/0033015 A1 * | 10/2001 | Corisis | ....................... 257/691 |
| 2004/0104465 A1 | 6/2004 | Kusakabe et al. | |

FOREIGN PATENT DOCUMENTS

| JP | 07-014976 | | 1/1995 |
|---|---|---|---|
| JP | 11-87409 | A | 3/1999 |
| JP | 2000-277657 | | 10/2000 |
| JP | 2001-274323 | A | 10/2001 |
| JP | 2004-128169 | | 4/2004 |

OTHER PUBLICATIONS

Japanese Office Action, with partial English translation, issued in Japanese Patent Application No. 2005-283020, mailed Apr. 7, 2009.

* cited by examiner

*Primary Examiner*—Lex Malsawma
(74) *Attorney, Agent, or Firm*—McDermott Will & Emery LLP (57) ABSTRACT

Disclosed is a method for manufacturing a method for manufacturing a semiconductor device which comprises a substrate, a semiconductor chip and a plurality of terminals. The method comprises preparing the substrate comprising an insulator which is formed with a plurality of signal lines, a plurality of power lines related to the plurality of signal lines and a plurality of ground lines related to the plurality of signal lines on the insulator in accordance with a predetermined layout. Each of the plurality of line groups comprises one of the power lines, one of the ground lines and one of the signal lines arranged between the one of the power lines and the one of the ground lines. Each of the plurality of line groups shares any one of the power line and the ground line with a neighboring line group of the plurality of line groups.

17 Claims, 9 Drawing Sheets

METHOD FOR MANUFACTURING SEMICONDUCTOR DEVICE, SEMICONDUCTOR DEVICE AND APPARATUS COMPRISING SAME

BACKGROUND OF THE INVENTION

The present invention generally relates to a method for manufacturing a semiconductor device. The semiconductor device is included in various apparatuses, such as a mobile phone and a computer. More particularly, the present invention relates to a method for manufacturing a semiconductor package, such as a ball grid array (BGA) package, comprising a semiconductor chip having a center pad structure. The semiconductor chip having the center pad structure comprises a principal surface and a line of pads provided with a plurality of pads arranged on a center region of the principal surface.

The BGA package comprises a semiconductor chip, such as a DRAM chip, having the center pad structure. The BGA package further comprises an insulator tape and a plurality of solder balls. The insulator tape has an upper surface and a lower surface. The semiconductor chip is mounted on the upper surface of the insulator tape. Between the insulator tape and the semiconductor chip, an elastomer layer is present. The plurality of solder balls as external terminals are arranged on the lower surface. For example, known techniques are disclosed in JP-A 2001-274323 and JP-A H11-87409, which are incorporated herein by reference in their entireties.

An arrangement of the plurality of solder balls in the BGA package is standardized by JEDEC for achieving greater versatility.

The BGA package further comprises a plurality of DQ lines, a plurality of VDDQ lines and a plurality of VSSQ lines. To improve the data transfer rate of the DRAM, one of the DQ lines should be arranged between one of the VDDQ lines related to the one of the DQ line and one of the VSSQ lines related to the one of the DQ line so that the plurality of DQ lines are shielded each other. The arrangement also causes feedback current illustrated in FIG. 1 relating to both logical low output and logical high output to flow through a nearest VDDQ line and a nearest VSSQ line so that the effective inductance for signals relating to the plurality of DQ lines is lowered.

Because the number of pads on the DRAM chip are limited and a layout of lines in the BGA package has constraint. Some of the DQ lines are not arranged between the VDDQ lines and the VSSQ lines according to the known techniques.

Therefore, it is an object of the present invention to provide a method for manufacturing a semiconductor device having a layout in which a signal line, such as a DQ line, arranged between a power line relating to the signal line, such as a VDDQ line, and a ground line relating to the signal line, such as a VSSQ line. The power line relating to the signal line and the ground line relating to the signal line are different from a power line and a ground line of the semiconductor chip. Moreover, it is further object of the present invention to provide the semiconductor device and an apparatus comprising the same.

SUMMARY OF THE INVENTION

According to an aspect of the present invention, there is provided a method for manufacturing a semiconductor device which comprises a substrate, a semiconductor chip and a plurality of terminals. The semiconductor chip comprising a principal surface and being mounted on the substrate, the plurality of terminals comprising a plurality of signal terminals, a plurality of power terminals related to the plurality of signal terminals and a plurality of ground terminals related to the plurality of signal terminals. The method comprises preparing the substrate comprising an insulator which is formed with a plurality of signal lines, a plurality of power lines related to the plurality of signal lines and a plurality of ground lines related to the plurality of signal lines on the insulator in accordance with a predetermined layout. The method further comprises disposing a line of pads on the principal surface of the semiconductor chip in accordance with a pad layout defined by the predetermined layout, wherein the line of pads comprises a plurality of signal pads, a plurality of power pads related to the plurality of signal pads, a plurality of ground pads related to the plurality of signal pads. The method further comprises connecting the plurality of signal lines, the plurality of power lines and the plurality of ground lines with the plurality of signal pads, the plurality of power pads and the plurality of ground pads respectively. The method further comprises connecting the signal terminals, the power terminals and the ground terminals with the plurality of signal lines, the plurality of power lines and the plurality of ground lines respectively. The insulator comprises a first region and a second region. The line of pads is arranged between the first region and the second region. The predetermined layout comprises a plurality of line groups, ones of which are arranged in the first region, while remaining line groups are arranged in the second region. Each of the plurality of line groups comprises one of the power lines, one of the ground lines and one of the signal lines arranged between the one of the power lines and the one of the ground lines. Each of the plurality of line groups shares any one of the power line and the ground line with a neighboring line group of the plurality of line groups.

According to another aspect of the present invention, there is provided a semiconductor device comprising a substrate, a semiconductor is chip, a plurality of signal terminals, a plurality of power terminals and a plurality of ground terminals. The substrate is provided with a insulator on which a plurality of signal lines, a plurality of power lines related to the plurality of signal lines and a plurality of ground lines related to the plurality of signal lines are disposed in accordance with a predetermined layout, the insulator comprising a first region and a second region. The predetermined layout comprises a plurality of line groups, ones of which are arranged in the first region, while remaining line groups are arranged in the second region. Each of the plurality of line groups comprises one of the power lines, one of the ground lines and at least one of the signal line arranged between the one of the power lines and the one of the ground lines. Each of the plurality of line groups shares any one of the power line and the ground line with a neighboring line group of the plurality of line groups. The semiconductor chip is mounted on the substrate and comprises a principal surface and a line of pads disposed on the principal surface between the first region and the second region in accordance with a pad layout defined by the predetermined layout, the line of pads including a plurality of signal pads, a plurality of power pads related to the plurality of signal pads and a plurality of ground pads related to the plurality of signal pads, wherein the plurality of signal pads, the plurality of power pads and the plurality of ground pads are connected with the plurality of signal lines, the plurality of power lines and the plurality of ground lines respectively. The plurality of signal terminals connected with the plurality of signal lines. The plurality of power terminals related to the plurality of signal terminals and connected with the plurality of power lines. The plurality of ground terminals related to the plurality of signal terminals and connected with the plurality of ground lines.

According to another aspect of the present invention, there is provided an apparatus comprising the semiconductor device.

These and other objects, features and advantages of the present invention will become more apparent upon reading of the following detailed description along with the accompanied drawings.

DESCRIPTION OF PREFERRED EMBODIMENTS

Following descriptions are focused on layouts of pads and lines on the substrate which does not change the arrangement of the solder balls is aligned in accordance with the JEDEC standard.

An apparatus of an embodiment of the present invention, such as a mobile phone and a computer, comprises a semiconductor device. The semiconductor device is a semiconductor package, such as a BGA package, and comprises a dynamic random access memory (DRAM) chip, a substrate, an elastomer layer and a plurality of solder balls.

The substrate is made of an insulator tape, a plurality of ball lands and a plurality of lines. The insulator tape comprises an upper surface, a lower surface and an opening piercing from the upper surface to the lower surface. The ball lands are arranged on the upper surface of the insulator tape. The lines are arranged on the upper surface and in an area over the opening of the insulator tape.

The lines comprise a plurality of DQ lines, DQS, DQSB, RDQS and RDQSB lines and a plurality of VDDQ and VSSQ lines. The plurality of DQ lines and the DQS, the DQSB, the RDQS and the RDQSB lines are signal lines. A pair of the DQS and the DQSB lines and a pair of the RDQS and the RDQSB lines are pairs of complementary signal lines. The each pair of complementary signal lines is deemed to be a single line in this embodiment. The plurality of VDDQ lines are power lines related to the signal lines. The plurality of VSSQ lines are ground lines related to the signal lines. The lower surface except the plurality of ball lands is covered by an insulator material.

The DRAM chip comprises a principal surface and a line of pads at a center region of the principal surface. The DRAM chip is mounted on the upper surface of the insulator tape. The elastomer having an opening layer is arranged between the insulator tape and the DRAM chip. The line of pads in the center region is exposed through the openings of the elastomer and the insulator tape. The line of pads comprises a plurality of pads connected with the solder balls through the plurality of lines.

The plurality of pads comprises a plurality of DQ pads, DQS, DQSB, RDQS and RDQSB pads and a plurality of VDDQ and VSSQ pads. The plurality of DQ pads and the DQS, the DQSB, the RDQS and the RDQSB pads are signal pads. A pair of the DQS and the DQSB pads and a pair of the RDQS and the RDQSB pads are pairs of complementary signal pads. The plurality of VDDQ pads are power pads. The plurality of VSSQ pads are ground pads.

The plurality of solder balls are arranged on the lower surface of the insulator tape and are connected to the plurality of lines. The plurality of ball lands of the substrate is arranged between each of the plurality of solder balls and each of the plurality of lines. The plurality of solder balls comprise a plurality of DQ terminals, DQS, DQSB, RDQS and RDQSB terminals and a plurality of VDDQ and VSSQ terminals. The plurality of DQ terminals are signal terminals. A pair of the DQS and the DQSB terminals and a pair of the RDQS and the RDQSB terminals are pairs of complementary signal terminals. The plurality of VDDQ terminals are power terminals. The plurality of VSSQ terminals are ground terminals.

Figure 1:
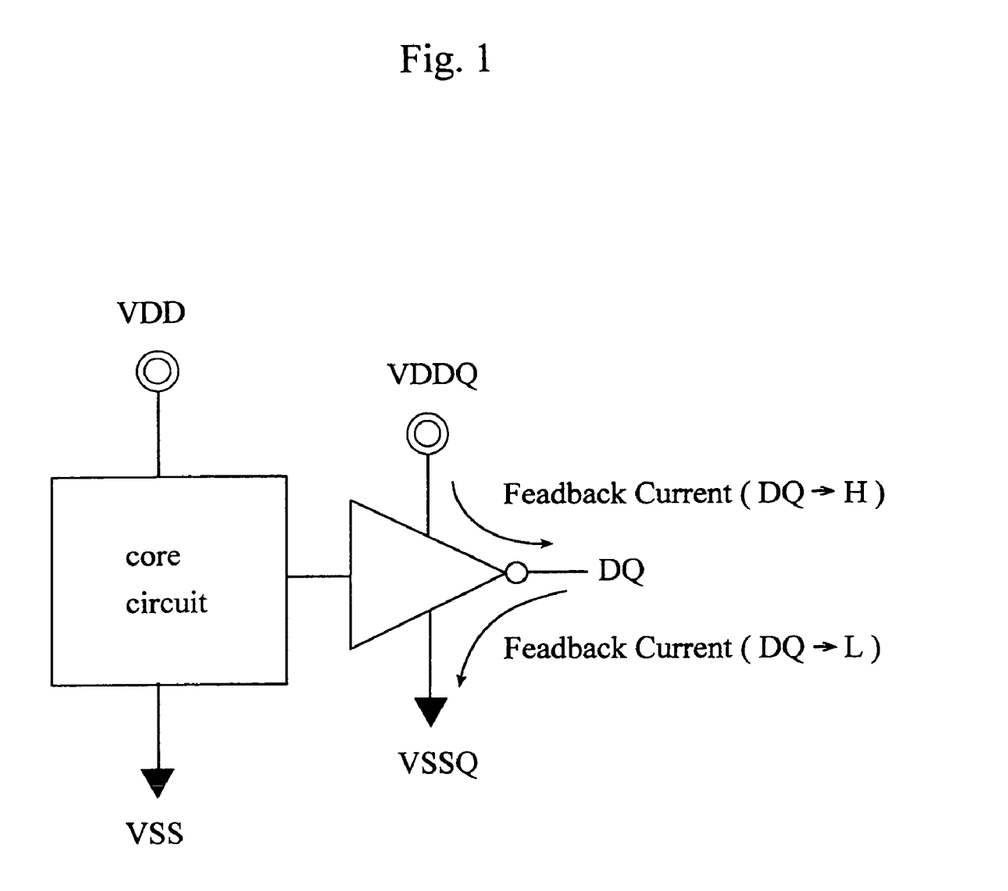
FIG. 1 is a block diagram for explaining the feedback current.
Figure 2:
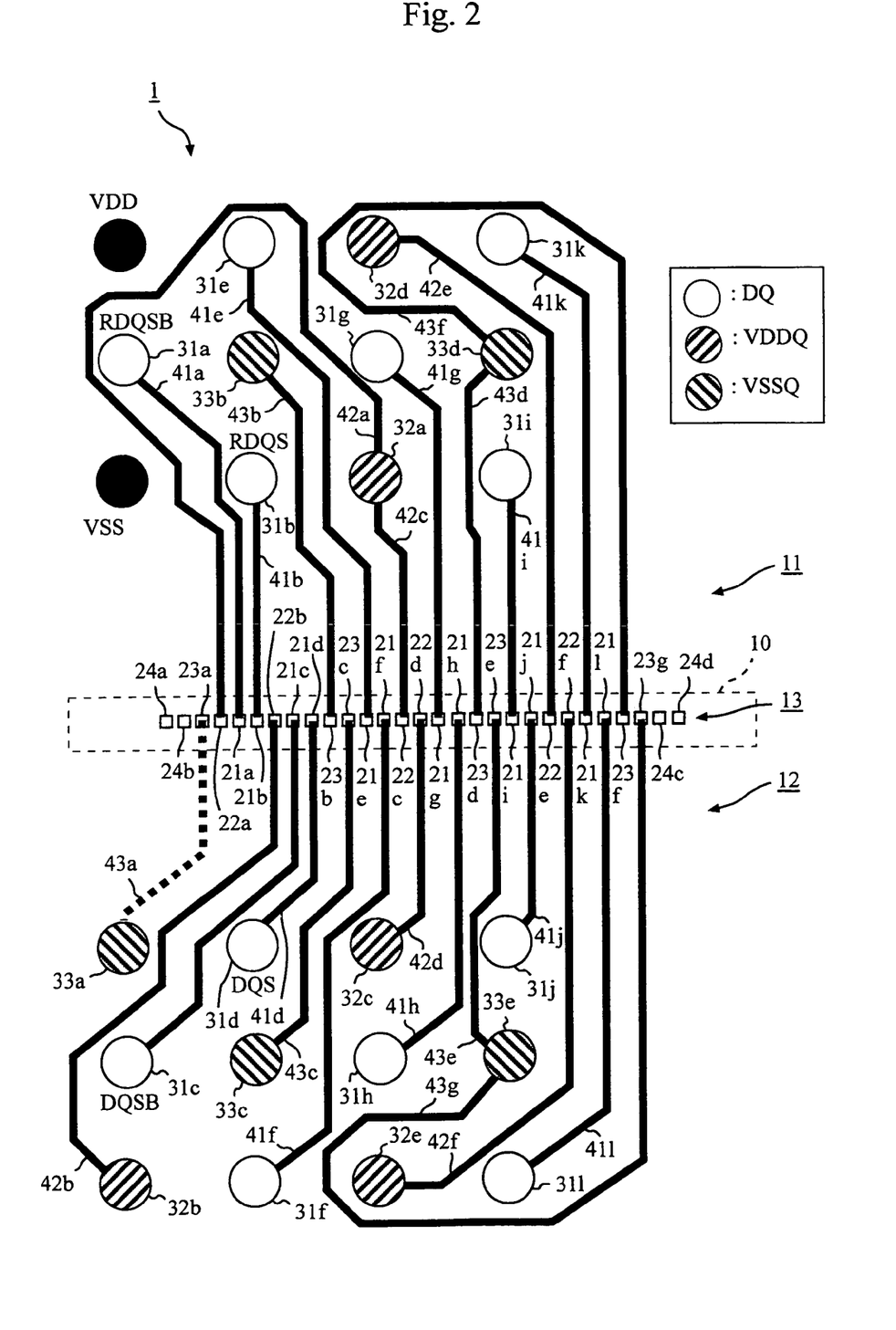
FIG. 2 is a first layout of an embodiment of the present invention.

A structural relationship and a positional relationship of the substrate, the DRAM chip and the plurality of solder balls are similar to those of the semiconductor package illustrated in FIGS. 1 and 2 of the JP-A H11-87409.

A method for manufacturing the semiconductor package comprises preparing the substrate. The insulator of the substrate is formed with a plurality of signal lines, a plurality of power lines related to the plurality of signal lines and a plurality of ground lines related to the plurality of signal lines arranged on the insulator in accordance with a predetermined layout. The method further comprises connecting the plurality of signal lines, the plurality of power lines and the plurality of ground lines with the plurality of signal pads, the plurality of power pads and the plurality of ground pads respectively, and connecting the signal terminals, the power terminals and the ground terminals with the plurality of signal lines, the plurality of power lines and the plurality of ground lines respectively.

FIG. 2 shows a first layout 1 of the plurality of solder balls, the plurality of lines and the line of pads of a first embodiment of the present invention which is viewed from the lower surface. The center region 10 of the semiconductor chip divides the upper surface of the insulator tape into the first region 11 and the second region 12.

The line of pads 13 is arranged in the center region 10 and comprises the plurality of pads including first to twelfth signal pads 21a to 21l represented by S, first to sixth VDDQ pads 22a to 22f represented by V, first to seventh VSSQ pads 23a to 23g represented by G and first to fourth other pads 24a to 24d represented by M arranged in an order of MMGVSSVSSGGSSVVSSGGSSVVSSGGMM.

The first to the twelfth signal pads 21a to 21l are arranged from left to right in that order. The first to the sixth VDDQ pads 22a to 22f are arranged from left to right in that order. The first to the seventh VSSQ pads 23a to 23g are arranged from left to right in that order.

The line of pads 13 includes a unit array in which the pads are arranged in an order of GSSVVSSG The line of pads 13 includes an array G-GSSVVSSG-GSSVVSSG-G in which the two unit array is arranged between the two Gs.

The semiconductor package comprises RDQSB terminal 31a, RDQS terminal 31b, DQSB terminal 31c, DQS terminal 31d, first to eighth DQ terminals 31e to 31l, first to fifth VDDQ terminals 32a to 32e and first to fifth VSSQ terminals 33a to 33e.

The RDQSB terminal 31a, the RDQS terminal 31b, the first, the third, the fifth and the seventh DQ terminals 31e, 31g, 31i and 31k, the first and the fourth VDDQ terminals 32a and 32d and the second and the fourth VSSQ terminals 33b and 33d are arranged in the fist region 11. The DQSB terminal 31c and the DQS terminal 31d, the second, the fourth, the sixth and the eighth DQ terminals 31f, 31h, 31j and 31l, the second, the third and the fifth VDDQ terminals 32b, 32c and 32e and the first, the third and the fifth VSSQ terminals 33a, 33c and 33e are arranged in the second region 12.

The plurality of lines comprises RDQSB line 41a, RDQS line 41b, DQSB line 41c, DQS line 41d, first to eighth DQ lines 41c to 41l, first to sixth VDDQ lines 42a to 42f and first and seventh VSSQ lines 43a and 43g.

The RDQSB, the RDQS, the DQSB and the DQS lines 41a to 41d are arranged to connect the RDQSB, the RDQS, the DQSB and the DQS terminal 31a to 31d with the first to the fourth signal pad 21a to 21d respectively. The first to the eighth DQ lines 41e to 41l are arranged to connect the DQ terminals 31e to 31l with the fifth to the twelfth signal pads 21e to 21l respectively.

The first and the third VDDQ line 42a and 42c are arranged to connect the first VDDQ terminal 32a with the first and the third VDDQ pads 22a and 22c respectively. The second and the fourth to the sixth VDDQ line 42b and 42d to 42f are arranged to connect the second and the third to the fifth VDDQ terminals 32b and 32c to 32e with the second and the fourth to the sixth VDDQ pads 22b and 22d to 22f respectively.

The first to the third VSSQ lines 43a to 43c connect the first to the third VSSQ terminals 33a to 33c with the first to the third VSSQ pads 23a to 23c respectively. The fourth and the sixth VSSQ lines 43d and 43f connect the fourth VSSQ terminal 33d with the fourth and the sixth VSSQ pads 23d and 23f respectively. The fifth and the seventh VSSQ lines 43e to 43g connect the fifth VSSQ terminal 33e with the fifth and the seventh VSSQ pads 23e and 23g respectively.

In the first region 11, the lines comprises first to fifth line groups.

The first line group comprises the pair of the RDQSB line 41a and the RDQS line 41b, the first VDDQ line 42a and the second VSSQ line 43b. The pair of the RDQSB line 41a and the RDQS line 41b is arranged between the first VDDQ line 42a and the second VSSQ line 43b.

The second line group comprises the first DQ line 41e, the third VDDQ line 42c and the second VSSQ line 43b. The first DQ line 41e is arranged between the third VDDQ line 42c and the second VSSQ line 43b.

The second line group shares the second VSSQ line 43b with the first line group. The first and the third VDDQ lines 42a and 42c are connected each other at the first VDDQ terminal 32a and surround the RDQSB line 41a, the RDQS line 41b, the first VSSQ line 43b and the first DQ line 41e.

The third line group comprises the third DQ line 41g, the third VDDQ line 42c and the fourth VSSQ line 43d. The third DQ line 41g is arranged between the third VDDQ line 42c and the fourth VSSQ line 43d. The third line group shares the third VDDQ line 42c with the second line group.

The fourth line group comprises the fifth DQ line 41i, the fifth VDDQ line 42e and the fourth VSSQ line 43d. The fifth DQ line 41i is arranged between the fifth VDDQ line 42e and the fourth VSSQ line 43d. The fourth line group shares the fourth VSSQ line 43d with the third line group.

The fifth line group comprises the seventh DQ line 41k, the fifth VDDQ line 42e and the sixth VSSQ line 43f. The seventh DQ line 41k is arranged between the fifth VDDQ line 42e and the sixth VSSQ line 43f.

The fifth line group shares the fifth VDDQ line 42e with the fourth line group. The fourth and the sixth VSSQ lines 43d and 43f are connected each other at the fourth VSSQ terminal 33b and surround the fifth and the seventh DQ lines 41i and 41k and the fifth VDDQ line 42e.

In the second region 12, the lines comprises sixth to tenth line groups.

The sixth line group comprises the pair of the DQSB line 41c and the DQS line 41d, the second VDDQ line 42b and the third VSSQ line 43c. The pair of the DQSB line 41c and the DQS line 41d is arranged between the third VDDQ line 42b and the third VSSQ line 43c.

The seventh line group comprises the second DQ line 41f, the fourth VDDQ line 42d and the third VSSQ line 43c. The second DQ line 41f is arranged between the fourth VDDQ line 42d and the third VSSQ line 43c. The seventh line group shares the third VSSQ line 43c with the sixth line group.

The eighth line group comprises the fourth DQ line 41h, the fourth VDDQ line 42d and the fifth VSSQ line 43e. The fourth DQ line 41h is arranged between the fourth VDDQ line 42d and the fifth VSSQ line 43e. The eighth line group shares the fourth VDDQ line 42d with the seventh line group.

The ninth line group comprises the sixth DQ line 41j, the sixth VDDQ line 42f and the fifth VSSQ line 43e. The sixth DQ line 41j is arranged between the sixth VDDQ line 42f and the fifth VSSQ line 43e. The ninth line group shares the fifth VSSQ line 43e with the eighth line group.

The tenth line group comprises the eighth DQ line 41l, the sixth VDDQ line 42f and the seventh VSSQ line 43g. The eighth DQ line 41l is arranged between the sixth VDDQ line 42f and the seventh VSSQ line 43g.

The tenth line group shares the sixth VDDQ line 42f with the ninth line group. The fifth and the seventh VSSQ lines 43e and 43g are connected each other at the fifth VSSQ terminal 33e and surround the sixth and the eighth DQ lines 41j and 41l and the sixth VDDQ line 42f.

In each line group, the signal line is arranged between the power line and the ground line of the same group. Each neighboring line groups shares at least one of the power line and the ground line.

Figure 3:
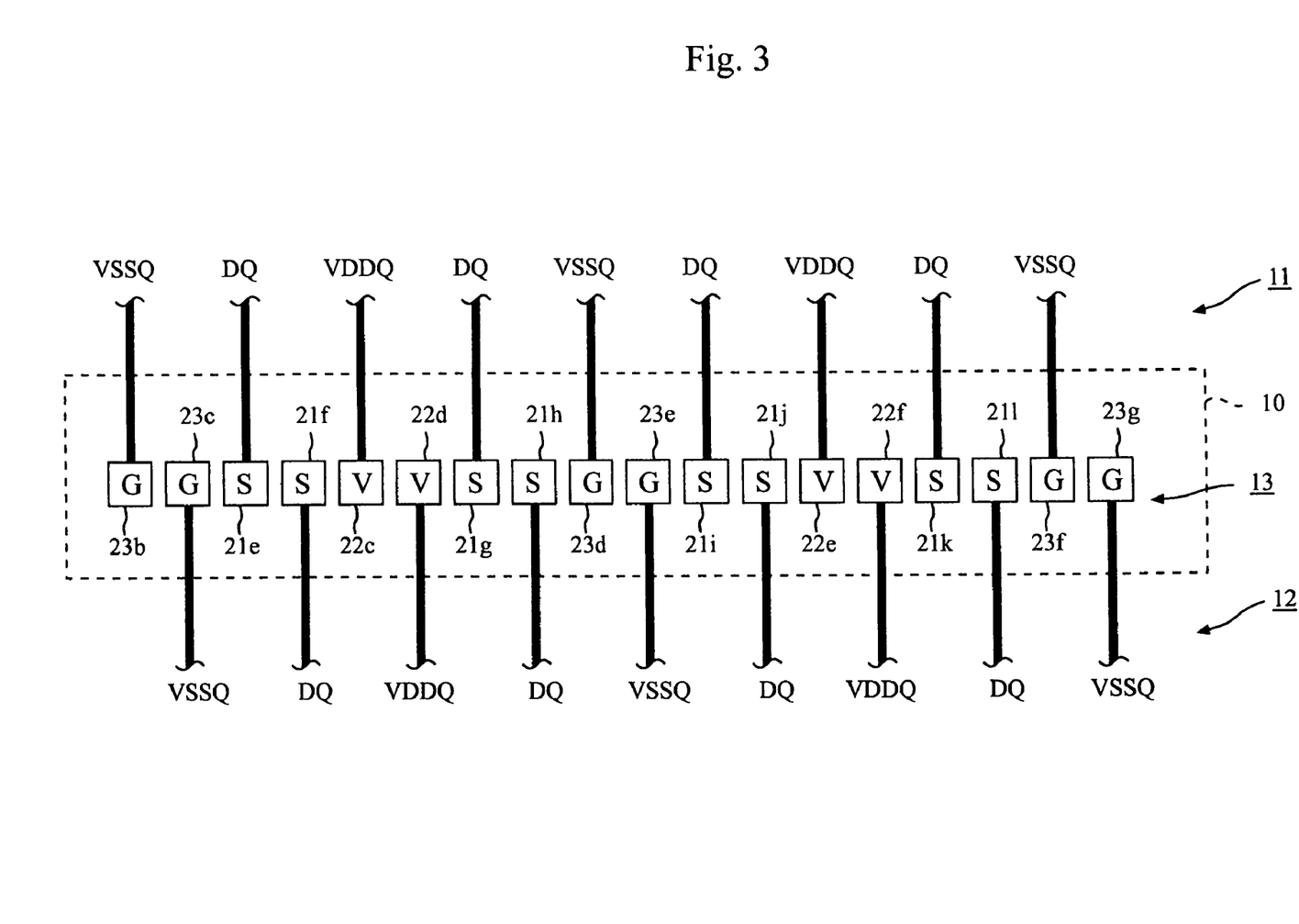
FIG. 3 is a partial enlarged view of the line of pads of FIG. 2.

Referring to FIG. 3, the plurality of lines connected with the pads disposed in the order of GGSSVVSSGGSSV-VSSGG are elongated into the first region 11 and the second region 12, alternately.

Figure 4:
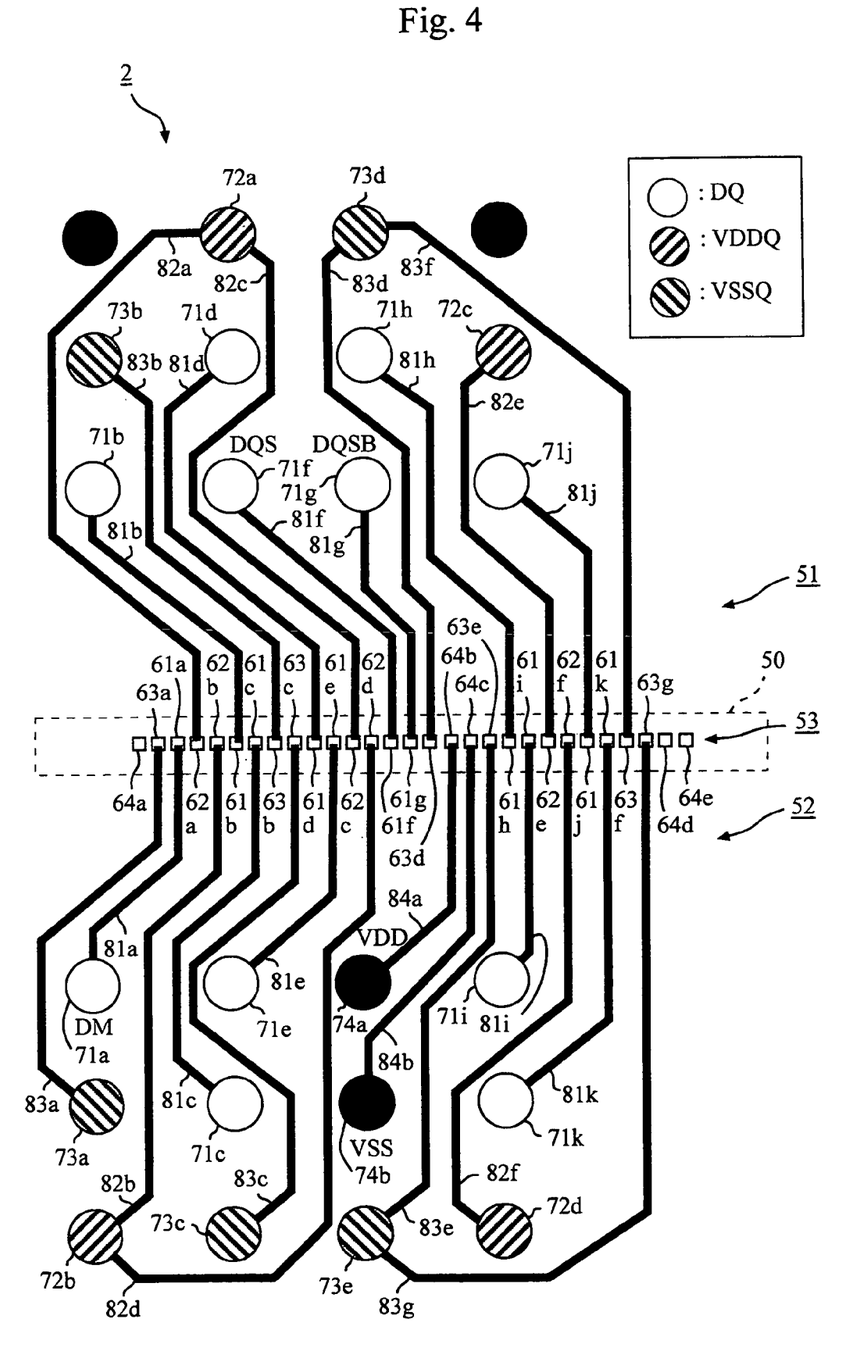
FIG. 4 is a second layout of an embodiment of the present invention.

FIG. 4 shows a second layout 2 of the plurality of solder balls, the plurality of lines and the line of pads of a second embodiment of the present invention which is viewed from the lower surface. A center region 50 of a semiconductor chip divides an upper surface of an insulator tape into a first region 51 and a second region 52.

A line of pads 53 is arranged in the center region 50 and comprises a plurality of pads including first to eleventh signal pads 61a to 61k represented by S, first to sixth VDDQ pads 62a to 62f represented by V, first to seventh VSSQ pads 63a to 63g represented by G and first to fourth other pads 64a to 64e represented by M arranged in an order of MGSVVSSGGSS-VVSSGMMGSSVVSSGGMM.

The first to the eleventh signal pads 61a to 61k are arranged from left to right in that order. A pair of the sixth and the seventh signal pads 61f and 61g is a pair of complementary signal pads. The first to the sixth VDDQ pads 62a to 62f are arranged from left to right in that order. The first to the seventh VSSQ pads 63a to 63g are arranged from left to right in that order. The second to the fifth signal pads 61b to 61e and the eighth and the eleventh signal pads 61h to 61k are DQ pads. The first signal pads 61a is a DM pad. The sixth and the seventh signal pads are DQS and DQSB pads respectively. The second and the third other pads 64b and 64c are VDD and VSS pads respectively.

The line of pads 53 includes first and second unit arrays. In the first unit array, the pads are arranged in an order of GSS-VVSSG. In the second unit array, the pads are arranged in an order of VSSGGSSV. The line of pads 53 includes a third array G-GSSVVSSG-G in which the first unit array is arranged between the two Gs. The line of pads 53 includes fourth array V-VSSGGSSV-V in which the second unit array is arranged between the two Vs. The line of pads 53 includes an array V-VSSGGSSV-V-SS-G-GSSVVSSG-G in which the pair of complementary signal pads is arranged between the fourth unit array and the third unit array.

The semiconductor package comprises DM terminal 71a, first to fourth DQ terminals 71b to 71e, DQS terminal 71f, DQSB terminal 71g, fifth to eighth DQ terminals 71h to 71k, first and fourth VDDQ terminals 72a and 72d, first and fifth VSSQ terminals 73a and 73e, VDD terminal 74a and VSS terminal 74b.

The first and the third DQ terminals 71b and 71d, the DQS and the DQSB terminals 71f and 71g, the fifth and the seventh DQ terminals 71h and 71j, the first and the third VDDQ terminals 72a and 72c and the second and the fourth VSSQ terminal 73b and 73d are arranged in the fist region 51. The DM terminal 71a, the second and the fourth DQ terminals 71c and 71e, the sixth and the eighth DQ terminals 71j and 71k, the second and the fourth VDDQ terminals 72b and 72d and the first, the third and the fifth VSSQ terminals 73a, 73c and 73e, the VDD terminal 74a and the VSS terminal 74b are arranged in the second region 52.

The plurality of lines comprises a DM line 81a, first to fourth DQ lines 81b to 81e, DQS line 81f, DQSB line 81g, fifth to eighth DQ lines 81h to 81k, first to sixth VDDQ lines 82a to 82f, first to seventh VSSQ lines 83a to 83g, a VDD line 84a and a VSS line 84b.

The DM, the DQS and the DQSB lines 81a, 81f and 81g are arranged to connect the DM, the DQS and the DQSB terminals 71a, 71f and 71g with the DM, the DQS and the DQSB pads 61a, 61f and 61g respectively. The first to the fourth DQ lines 81b to 81e are arranged to connect the first to the fourth DQ terminals 71b to 71e with the fifth to the fourth DQ pads 61b to 61e respectively. The fifth to the eighth DQ lines 81h to 81k are arranged to connect the fifth to the eighth DQ terminals 71h to 71k with the fifth to the eighth DQ pads 61h to 61k respectively.

The first and the third VDDQ lines 82a and 82c are arranged to connect the first VDDQ terminal 72a with the first and the third VDDQ pads 62a and 62c respectively. The second and the fourth VDDQ line 82b and 82d connect the second VDDQ terminal 72b with the second and the fourth VDDQ pads 62b and 62d respectively. The fifth VDDQ line 82e is arranged to connect the third VDDQ terminal 72c with the fifth VDDQ pad 62e. The sixth VDDQ line 82f are arranged to connect the fourth VDDQ terminal 72d with the sixth VDDQ pads 62f.

The first to the third VSSQ lines 83a to 83c are arranged to connect the first to the third VSSQ terminals 73a to 73c with the first to the third VSSQ pads 63a to 63c respectively. The fourth and the sixth VSSQ lines 83d and 83f are arranged to connect the fourth VSSQ terminal 73d with the fourth and the sixth VSSQ pads 63d and 63f respectively. The fifth and the seventh VSSQ lines 83e to 83g are arranged to connect the fifth VSSQ terminal 73e with the fifth and the seventh VSSQ pads 63e and 63g respectively.

In the first region 51, the lines comprises first to fifth line groups.

The first line group comprises the second DQ line 81b, the first VDDQ line 82a and the second VSSQ line 83b. The second DQ line 81b is arranged between the first VDDQ line 82a and the second VSSQ line 83b.

The second line group comprises the fourth DQ line 81d, the third VDDQ line 82c and the second VSSQ line 83b. The fourth DQ line 81d is arranged between the third VDDQ line 82c and the second VSSQ line 83b.

The second line group shares the second VSSQ line 83b with the first line group. The first and the third VDDQ lines 82a and 82c are connected each other at the first VDDQ terminal and surround the first and the third DQ lines 81b and 81d and the first VSSQ line 83b.

The third line group comprises the pair of the DQS and the DQSB lines 81f and 81g, the third VDDQ line 82c and the fourth VSSQ line 83d. The pair of the DQS and the DQSB lines 81f and 81g is arranged between the third VDDQ line 82c and the fourth VSSQ line 83d. The third line group shares the third VDDQ line 82c with the second line group.

The fourth line group comprises the fifth DQ line 81h, the fifth VDDQ line 82e and the fourth VSSQ line 83d. The fifth DQ line 81h is arranged between the fifth VDDQ line 82e and the fourth VSSQ line 83d. The fourth line group shares the fourth VSSQ line 83d with the third line group.

The fifth line group comprises the seventh DQ line 81j, the fifth VDDQ line 82e and the sixth VSSQ line 83f. The seventh DQ line 81j is arranged between the fifth VDDQ line 82e and the sixth VSSQ line 83f.

The fifth line group shares the fifth VDDQ line 82e with the fourth line group. The fourth and the sixth VSSQ lines 83d and 83f are connected each other at the fourth VSSQ terminal 73d and surround the fifth and the seventh DQ lines 81h and 81j and the fifth VDDQ line 82e.

In the second region 52, the lines comprises sixth to tenth line groups.

The sixth line group comprises the DM line 81a, the second VDDQ line 82b and the first VSSQ line 83a. The DM line 81a is arranged between the second VDDQ line 82b and the first VSSQ line 83a.

The seventh line group comprises the second DQ line 81c, the second VDDQ line 82b and the third VSSQ line 83c. The second DQ line 81c is arranged between the second VDDQ line 82b and the third VSSQ line 83c. The seventh line group shares the second VDDQ line 82b with the sixth line group.

The eighth line group comprises the fourth DQ line 81e, the fourth VDDQ line 82d and the third VSSQ line 83c. The fourth DQ line 81e is arranged between the fourth VDDQ line 82d and the third VSSQ line 83c.

The eighth line group shares the third VSSQ line 83c with the seventh line group. The second and the fourth VDDQ lines 82b and 82d are connected each other at the second VDDQ terminal 72b and surround the second and the fourth DQ lines 81c and 81e and the third VSSQ line 83c.

The ninth line group comprises the sixth DQ line 81i, the sixth VDDQ line 82f and the fifth VSSQ line 83e. The sixth DQ line 81i is arranged between the sixth VDDQ line 82f and the fifth VSSQ line 83e.

The tenth line group comprises the eighth DQ line 81k, the sixth VDDQ line 82f and the seventh VSSQ line 83g. The eighth DQ line 81k is arranged between the sixth VDDQ line 82f and the seventh VSSQ line 83g.

The tenth line group shares the sixth VDDQ line 82f with the ninth line group. The fifth and the seventh VSSQ lines 83e and 83*g* are connected each other at the fifth VSSQ terminal 73*e* and surround the sixth and the eighth DQ lines 81*i* and 81*k* and the sixth VDDQ line 82*f*.

In each line group, the signal line is arranged between the power line and the ground line of the same group. Each neighboring line groups shares at least one of the power line and the ground line.

Figure 5:
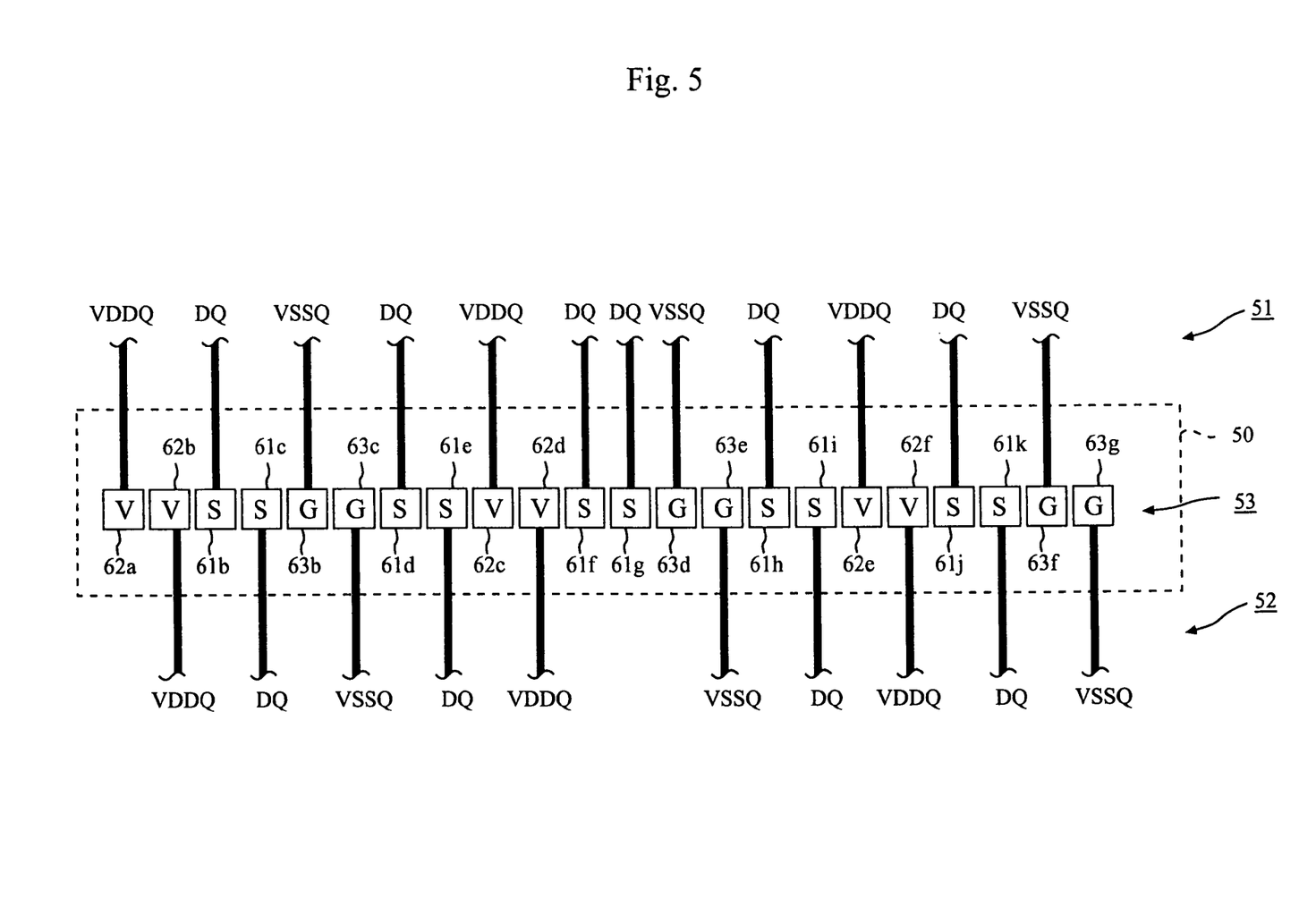
FIG. 5 is a partial enlarged view of the line of pads of FIG. 4.

Referring to FIG. 5, the plurality of lines connected with the pads disposed in the order of VVSSGGSSVVSSGGSS-VVSSGG are elongated into the first region 51 and the second region 52, alternately.

The line of pads may comprise an array in which the two second unit arrays are arranged in series.

Figure 6:
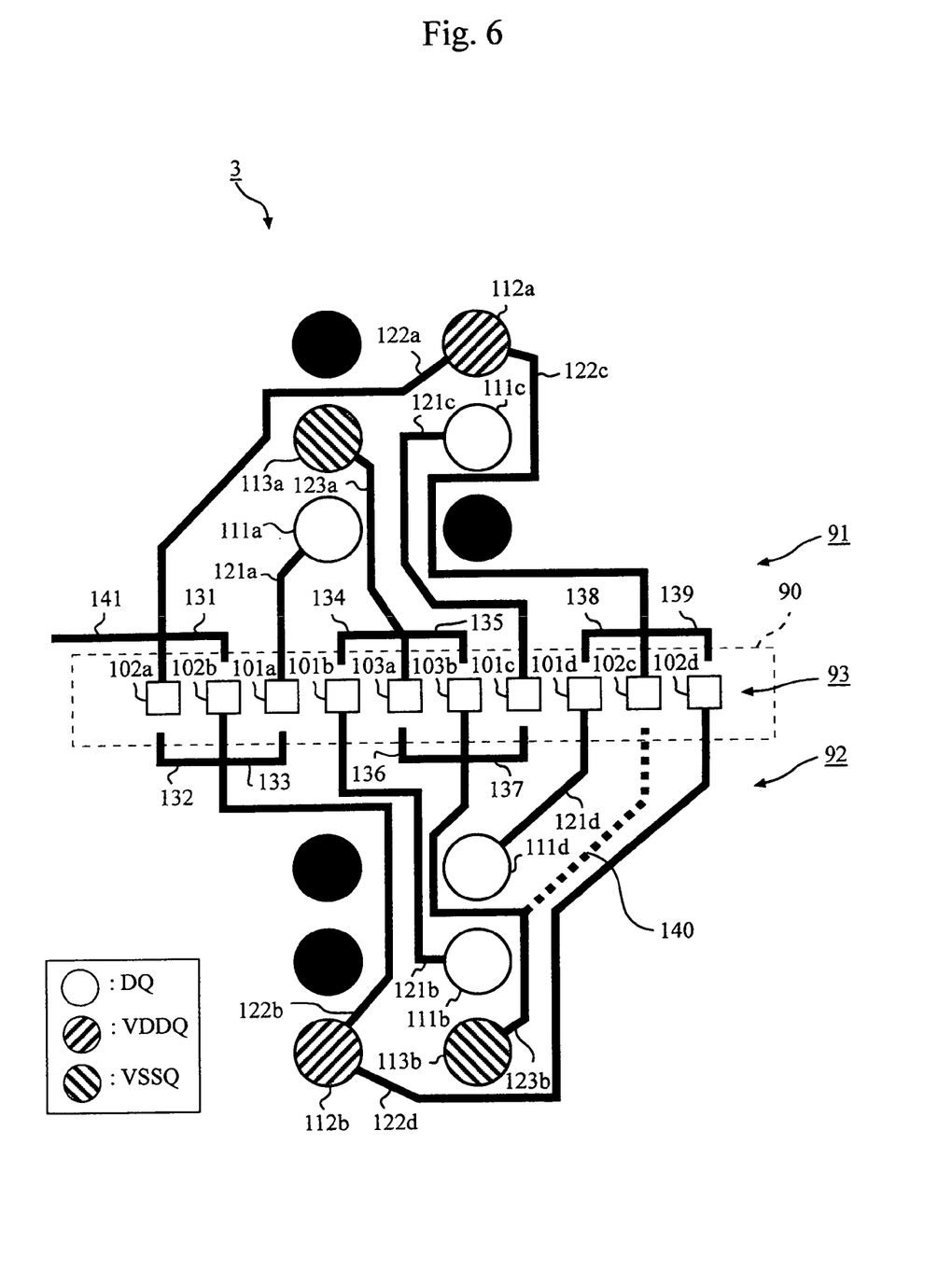
FIG. 6 is a third layout of an embodiment of the present invention.

FIG. 6 shows a third layout 3 of the plurality of solder balls, the plurality of lines and the line of pads of a third embodiment of the present invention which is viewed from the lower surface.

A center region 90 of a semiconductor chip divides an upper surface of an insulator tape into a first region 91 and a second region 92.

A line of pads 93 is arranged in the center region 90 and comprises a plurality of pads including first to fourth signal pads 101*a* to 101*d* represented by S, first to fourth VDDQ pads 102*a* to 102*d* represented by V and first and second VSSQ pads 103*a* and 103*b* represented by G arranged in an order of VVSSGGSSVV, that is the order of the fourth array.

The first to the fourth signal pads 101*a* to 101*d* are DQ pads and are arranged from left to right in that order. The first to the fourth VDDQ pads 102*a* to 102*d* are arranged from left to right in that order. The first and the second VSSQ pads 103*a* and 103*b* are arranged from left to right in that order.

The plurality of pads comprises first to fourth pad groups. The first pad group includes the first DQ pad 101*a*, the first VDDQ pad 102*a* and the first VSSQ pad 103*a*. The second pad group includes the third DQ pad 101*c*, the third VDDQ pad 102*c* and the first VSSQ pad 103*a*. The third pad group includes the second DQ pad 101*b*, the second VDDQ pad 102*b* and the second VSSQ pad 103*b*. The fourth pad group includes the fourth DQ pad 101*d*, the fourth VDDQ pad 102*d* and the second VSSQ pad 103*b*.

The semiconductor module comprises first to fourth DQ terminals 111*a* to 111*d*, first and second VDDQ terminals 112*a* and 112*b*, first and second VSSQ terminals 113*a* and 113*b*.

The first and third DQ terminals 111*a* and 111*c*, the first VDDQ terminal 112*a* and the first VSSQ terminal 113*a* are arranged in the fist region 91. The second and the fourth DQ terminals 111*b* and 111*d*, the second VDDQ terminal 112*b* and the second VSSQ terminal 113*b* are arranged in the second region 92.

The plurality of lines comprises first to fourth DQ lines 121*a* to 121*d*, first to fourth VDDQ lines 122*a* to 122*d*, first and second VSSQ lines 123*a* and 123*b*, first to tenth branch lines 131 to 140.

The first to fourth DQ lines 121*a* to 121*d* connect the first to the fourth DQ terminals 111*a* to 111*d* with the first to the fourth DQ pads 101*a* to 101*d*, respectively. The first and the third VDDQ lines 122*a* and 122*c* are arranged to connect the first VDDQ terminal 112*a* with the first and the third VDDQ pads 102*a* and 102*c* respectively. The second and the fourth VDDQ line 122*b* and 122*d* are arranged to connect the second VDDQ terminal 112*b* with the second and the fourth VDDQ pads 102*b* and 102*d*, respectively. The first and the second VSSQ lines 123*a* and 123*b* are arranged to connect the first and the second VSSQ terminals 113*a* and 113*b* with the first and the second VSSQ pads 103*a* and 103*b* respectively.

In the first region 91, the lines comprises first and second line groups. The first line group comprises the first DQ line 121*a*, the first VDDQ line 122*a* and the first VSSQ line 123*a*. The first DQ line 121*a* is arranged between the first VDDQ line 122*a* and the first VSSQ line 123*a*. The second line group comprises the third DQ line 121*c*, the third VDDQ line 122*c* and the first VSSQ line 123*a*. The third DQ line 121*c* is arranged between the third VDDQ line 122*c* and the first VSSQ line 123*a*. The second line group shares the first VSSQ line 123*a* with the first line group. The first and the third VDDQ lines 122*a* and 122*c* are connected each other at the first VDDQ terminal 112*a* and surround the first and the third DQ lines 121*a* and 121*c* and the first VSSQ line 123*a*.

In the second region 92, the lines comprises third and fourth line groups. The third line group comprises the second DQ line 121*b*, the second VDDQ line 122*b* and the second VSSQ line 123*b*. The second DQ line 121*b* is arranged between the second VDDQ line 122*b* and the second VSSQ line 123*b*. The fourth line group comprises the fourth DQ line 121*d*, the fourth VDDQ line 122*d* and the second VSSQ line 123*b*. The fourth DQ line 121*d* is arranged between the fourth VDDQ line 122*d* and the second VSSQ line 123*b*. The fourth line group shares the second VSSQ line 123*b* with the third line group. The second and the fourth VDDQ lines 122*b* and 122*d* are connected each other at the second VDDQ terminal 112*b* and surround the second and the fourth DQ lines 121*b* and 121*d* and the second VSSQ line 123*b*.

In each line group, the signal line is arranged between the power line and the ground line of the same group. Each neighboring line groups shares at least one of the power line and the ground line. The plurality of lines connected with the pads disposed in the order of VVSSGGSSVV are elongated into the first region 91 and the second region 92, alternately.

In the first region 91, the first branch line 131 is in contact with the first VDDQ lien 122*a* and is elongated toward the second VDDQ pad 102*b*. The fourth branch line 134 is in contact with the first VSSQ line 123*a* and is elongated toward the second DQ pad 101*b*. The fifth branch line 135 is in contact with the first VSSQ line 123*a* and is elongated toward the second VDDQ pad 102*b*. The eighth branch line 138 is in contact with the third VDDQ line 122*c* and is elongated toward the fourth DQ pad 102*d*. The ninth branch line 139 is in contact with the third VDDQ line 122*c* and is elongated toward the fourth VDDQ pad 102*d*. The leading line 141 is in contact with the first VDDQ line 122*a* and supply a voltage for plating.

In the second region 92, the second branch line 132 is in contact with the second VDDQ line 122*b* and is elongated toward the first VDDQ pad 102*a*. The third branch line 133 is in contact with the second VDDQ line 122*b* and is elongated toward the first DQ pad 101*a*. The sixth branch line 136 is in contact with the second VSSQ line 123*b* and is elongated toward the first VSSQ pad 103*a*. The seventh branch line 137 is in contact with the second VSSQ line 123*b* and is elongated toward the third DQ pad 101*c*. The tenth branch line 140 is in contact with the VSSQ line 123*b* and is elongated toward the third VDDQ pad 102*c*.

A process for fabricating the plurality of lines includes the electrolytic plating process. During the electrolytic plating process, the first branch line 131 is in contact with the second VDDQ line 122*b*, the second branch line 132 is in contact with the first VDDQ line 122*a*, the third branch line 133 is in contact with the first DQ line 121*a*, the fourth branch line 134 is in contact with the second DQ line 121*b*, the fifth branch line 135 is in contact with the second VSSQ line 123*b*, the sixth branch line 136 is in contact with the first VSSQ line 123*a*, the seventh branch line 137 is in contact with the third DQ line 121c, the eighth branch line 138 is in contact with the fourth DQ line 121d, the ninth branch line 139 is in contact with the fourth VDDQ line 122d, and the tenth branch line is in contact with the third VDDQ line 122c. The leading line 141 is in contact with the first VDDQ line 122a.

The first to the tenth branch lines 131 to 140 have narrow portions. When the DQ lines 121a to 121d, the first to the fourth VDDQ lines 122a to 122d and the first and the second VSSQ lines 123a and 123b are pressed toward the pads line 93 in the center region 90, the first to the tenth branch lines 131 to 140 are disconnected from the DQ lines 121a to 121d, the first to the fourth VDDQ lines 122a to 122d and the first and the second VSSQ lines 123a and 123b at the narrow portions, and the DQ lines 121a to 121d, the first to the fourth VDDQ lines 122a to 122d and the first and the second VSSQ lines 123a and 123b are connected to the plurality of pads in the pads line 93.

During the electrolytic plating process, all of the DQ lines 121a to 121d, the first to the fourth VDDQ lines 122a to 122d and the first and the second VSSQ lines 123a and 123b should be electrically connected to each other. In the third layout 3, the tenth branch line 140 which is longer than the first to the ninth branch lines 131 to 139. There are two pads between the second VSSQ pad 103b which is connected with the second VSSQ line 123b and the third VDDQ pad 102c to which the tenth branch line 140 is elongated. The fourth DQ line 121d is arranged between the second VSSQ line 123b and the tenth branch line 140.

Figure 7:
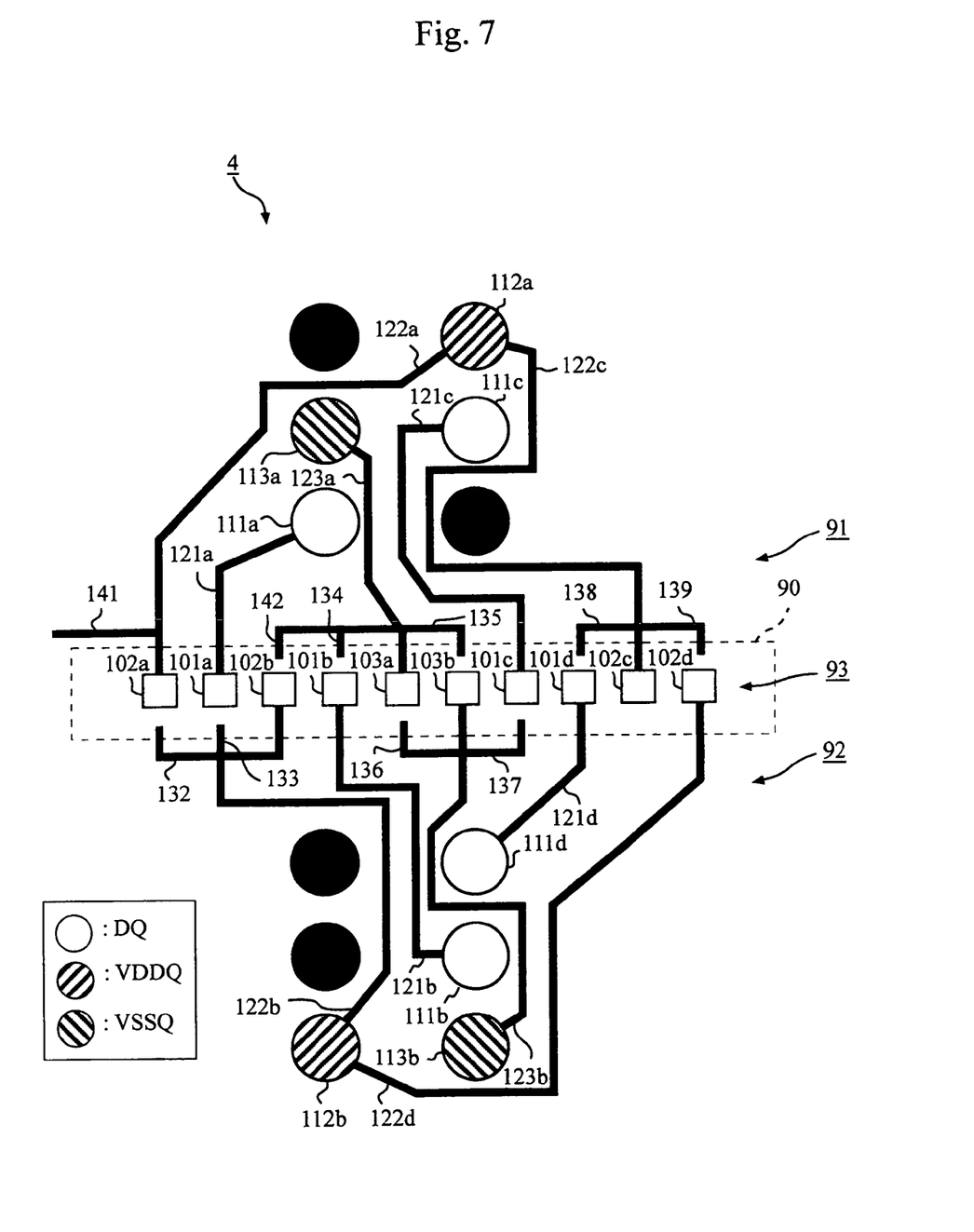
FIG. 7 is a fourth layout of an embodiment of the present invention.

FIG. 7 shows a fourth layout 4, which is one example of a modification of the third layout 3. The fourth layout 4 is obtained by changing positions of the first DQ pad 101a and the second VDDQ pad 102b of the third layout 3. In the fourth layout 4, the plurality of lines do not include the first branch line 131 and the tenth branch line 140. In the fourth layout 4, the plurality of lines includes an eleventh branch line 142 which is in contact with the first VSSQ line 123a in the first region 91. During the electrolytic plating process, the eleventh branch line 142 is in contact with the second VDDQ line 122b. The eleventh branch line 142 has a narrow portion. When the second VDDQ line 122b is pressed toward the pads line 93 in the center region 90, the eleventh branch line 141 is disconnected from the second VDDQ line 121b at the narrow portion, and the second VDDQ line 122b is connected to the second VDDQ pad 102b. The positions of the first DQ pad 101a and the second VDDQ pad 102b of the third layout 3 are changed so that the tenth branch line 140 of the third layout 3 is not needed in the fourth layout 4.

If the pad line 93 includes the first unit array of GSSV-VSSG or the second unit array of VSSGGSSV, at least one pair of (2n-1)-th (n is a natural number) pad and the 2n-th pad of the first or the second unit array are changed each other to remove the long branch line such as the tenth branch line 140 of the third layout 3. Preferably, between the signal pad and the power pad or between the signal pad and the ground pad in the same pad group, there may be only three or less other pads.

Figure 8:
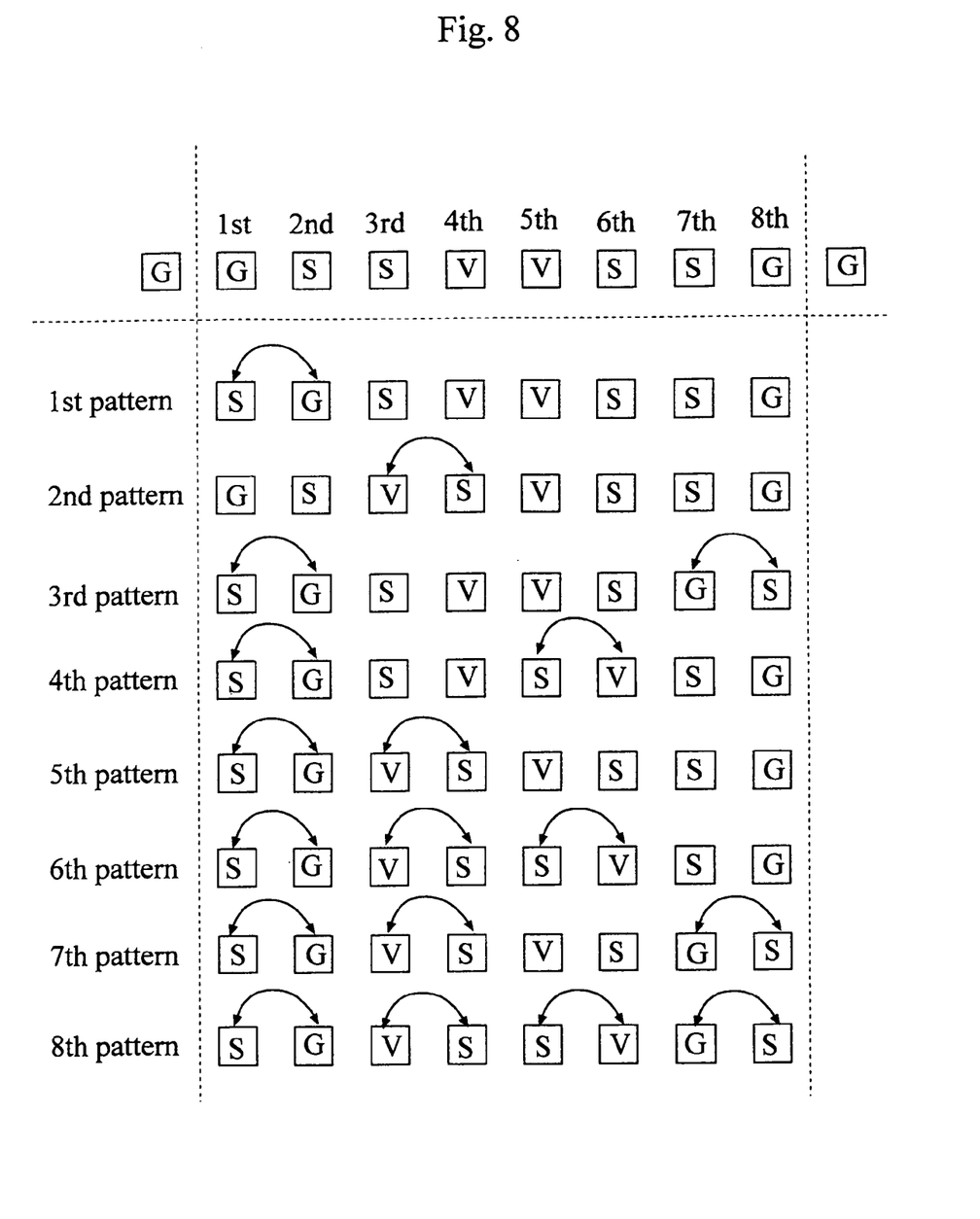
FIG. 8 is patterns of modification of the first unit array.
Figure 9:
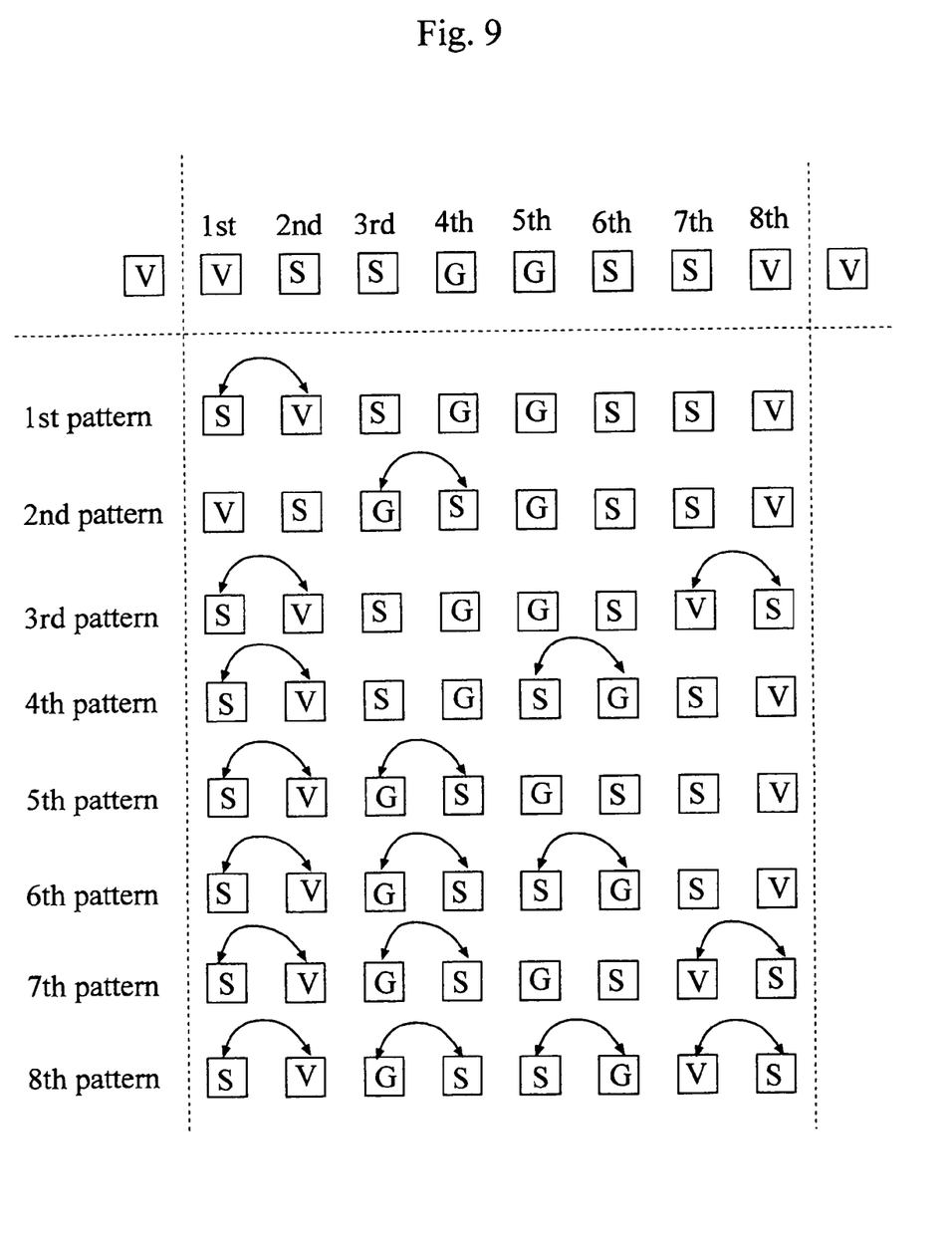
FIG. 9 is patterns of modification of the second unit array.

FIG. 8 shows first to eighth patterns of modification of the first unit array. FIG. 9 shows first to eighth patterns of modification of the second unit array. Referring to FIG. 8 and FIG. 9, each of the first patterns is obtained by a changing of places between the first pad and the second pad. Each of the second patterns is obtained by a changing of places between the third pad and the fourth pad. Each of the third patterns is obtained by a changing of places between the first pad and the second pad and a changing of places between the seventh pad and the eighth pad. Each of the fourth patterns is obtained by a changing of places between the first pad and the second pad and a changing of places between the fifth pad and the sixth pad. Each of the fifth patterns is obtained by a changing of places between the first pad and the second pad and a changing of places between the third pad and the fourth pad. Each of the sixth patterns is obtained by a changing of places between the first pad and the second pad, a changing of places between the third pad and the fourth pad and a changing of places between the fifth pad and the sixth pad. Each of the seventh patterns is obtained by a changing of places between the first pad and the second pad, a changing of places between the third pad and the fourth pad and a changing of places between the seventh pad and the eighth pad. Each of the eighth patterns is obtained by changing of places between the first pad and the second pad, a changing of places between the third pad and the fourth pad, a changing of places between the fifth pad and the sixth pad and a changing of places between the seventh pad and the eighth pad.

Preferably, the VDDQ pad and the VSSQ pad are arranged as nearer as possible to the DQ pad so that a pathway of the feedback current is shortened and the effective inductance is lowered.

This application is based on Japanese Patent Application serial no. 2005-283020 filed in Japan Patent Office on Sep. 28, 2005, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be constructed as being included therein.

What is claimed is:

1. A method for manufacturing a semiconductor device which comprises a substrate, a semiconductor chip and a plurality of terminals, the semiconductor chip comprising a principal surface and being mounted on the substrate, the plurality of terminals comprising a plurality of signal terminals, a plurality of power terminals related to the plurality of signal terminals and a plurality of ground terminals related to the plurality of signal terminals, the method comprising the steps of;

preparing the substrate comprising an insulator which is formed with a plurality of signal lines, a plurality of power lines related to the plurality of signal lines and a plurality of ground lines related to the plurality of signal lines on the insulator in accordance with a predetermined layout;

disposing a line of pads on the principal surface of the semiconductor chip in accordance with a pad layout defined by the predetermined layout, wherein the line of pads comprises a plurality of signal pads, a plurality of power pads related to the plurality of signal pads, a plurality of ground pads related to the plurality of signal pads;

connecting the plurality of signal lines, the plurality of power lines and the plurality of ground lines with the plurality of signal pads, the plurality of power pads and the plurality of ground pads respectively; and connecting the signal terminals, the power terminals and the ground terminals with the plurality of signal lines, the plurality of power lines and the plurality of ground lines respectively; wherein:

the insulator comprises a first region and a second region;
the line of pads is arranged between the first region and the second region;

the predetermined layout comprises a plurality of line groups, ones of which are arranged in the first region, while remaining line groups are arranged in the second region;

each of the plurality of line groups comprises one of the power lines, one of the ground lines and one of the signal lines arranged between the one of the power lines and the one of the ground lines; and each of the plurality of line groups shares any one of the power line and the ground line with a neighboring line group of the plurality of line groups.

2. The method according to claim 1, wherein:

the plurality of line groups comprises a first line group and a second line group which shares the power line with the first line group;

the signal lines and the shared power line of the first and the second line group are arranged between the ground line of the first line group and the ground line of the second line group; and the ground line of the first line group is in contact with the ground line of the second line group.

3. The method according to claim 1, wherein:

the plurality of line groups comprises a first line group and a second line group which shares the ground line with the first line group;

the signal lines and the shared ground line of the first and the second line group are arranged between the power line of the first line group and the power line of the second line group; and the power line of the first line group is in contact with the power line of the second line group.

4. The method according to claim 1, wherein:

the line of pads includes at least one of a first unit array and a second unit array; and in the first unit array, at least the signal pads, the power pads and the ground pads are arranged in accordance with an order of GSSVVSSG, while in the second unit array, at least the signal pads, the power pads and the ground pads are arranged in accordance with another order of VSSGGSSV where S represents the signal pad, V represents the power pad and G represents the ground pad.

5. The method according to claim 1, wherein:

the line of pads includes at least one of a first unit array and a second unit array;

in the first unit array, at least the signal pads, the power pads and the ground pads are arranged in accordance with an order of GSSVVSSG or in another order in which at least one pair of the (2n-1)-th pad and the 2n-th pad of the GSSVVSSG are changed each other, where n is a natural number, while in the second unit array, at least the signal pads, the power pads and the ground pads are arranged in accordance with an order of VSSGGSSV or in another order in which at least one pair of the (2m-1)-th pad and the 2m-th pad of the VSSGGSSV are changed each other, where m is a natural number, S represents the signal pad, V represents the power pad and G represents the ground pad.

6. The method according to claim 5, wherein:

the line of pads comprises a plurality of pad groups;

each of the plurality of pad groups comprises one of the signal pads, one of the power pads and one of the ground pads connected with the signal line, the power line and the ground line of the each line groups respectively;

between the signal pad and the power pad in the each of the plurality of pad groups, only three or less pads of other pad groups are arranged; and between the signal pad and the ground pad in the each of the plurality of pad groups, only three or less pads of other pad groups are arranged.

7. A semiconductor device comprising:

a substrate provided with an insulator on which a plurality of signal lines, a plurality of power lines related to the plurality of signal lines and a plurality of ground lines related to the plurality of signal lines are disposed in accordance with a predetermined layout, the insulator comprising a first region and a second region, wherein the predetermined layout comprises a plurality of line groups, ones of which are arranged in the first region, while remaining line groups are arranged in the second region, each of the plurality of line groups comprises one of the power lines, one of the ground lines and at least one of the signal line arranged between the one of the power lines and the one of the ground lines, and each of the plurality of line groups shares any one of the power line and the ground line with a neighboring line group of the plurality of line groups;

a semiconductor chip mounted on the substrate and comprises a principal surface and a line of pads disposed on the principal surface between the first region and the second region in accordance with a pad layout defined by the predetermined layout, the line of pads including a plurality of signal pads, a plurality of power pads related to the plurality of signal pads and a plurality of ground pads related to the plurality of signal pads, wherein the plurality of signal pads, the plurality of power pads and the plurality of ground pads are connected with the plurality of signal lines, the plurality of power lines and the plurality of ground lines respectively;

a plurality of signal terminals connected with the plurality of signal lines;

a plurality of power terminals related to the plurality of signal terminals and connected with the plurality of power lines; and a plurality of ground terminals related to the plurality of signal terminals and connected with the plurality of ground lines.

8. The semiconductor device according to claim 7, wherein:

the plurality of line groups comprises a first line group and a second line group which shares the power line with the first line group;

the signal lines and the shared power line of the first and the second line groups are arranged between the ground line of the first line group and the ground line of the second line group; and the ground line of the first line group is in contact with the ground line of the second line group.

9. The semiconductor device according to claim 7, wherein:

the plurality of line groups comprises a first line group and a second line group which shares the ground line with the first line group;

the signal lines and the shared ground line of the first and the second line group are arranged between the power line of the first line group and the power line of the second line group; and the power line of the first line group is in contact with the power line of the second line group.

10. The semiconductor device according to claim 7, wherein:

the line of pads includes a unit array; and in the unit array, at least the signal pads, the power pads and the ground pads are arranged in accordance with an order of GSSVVSSG, SGSVVSSG, GSVSVSSG, SGS-VVSGS, SGSVSVSG, SGVSVSSG, SGVSSVSG, SGVSVSGS or SGVSSVGS where S represents the signal pad, V represents the power pad and G represents the ground pad.

11. The semiconductor device according to claim 7, wherein:
the line of pads includes a unit array; and
in the unit array, at least the signal pads, the power pads and the ground pads are arranged in accordance with an order of VSSGGSSV, SVSGGSSV, VSGSGSSV, SVSGGSVS, SVSGSGSV, SVGSGSSV, SVGSSGSV, SVGSGSVS or SVGSSGVS where S represents the signal pad, V represents the power pad and G represents the ground pad.

12. The semiconductor device according to claim 7, wherein:
the pad line comprises a plurality of pad groups;
each of the plurality of pad groups comprises one of the signal pads, one of the power pads and one of the ground pads, which are connected with the signal line, the power line and the ground line of one of the line groups respectively;
between the signal pad and the power pad in the each pad group, only three or less pads of other pad groups are arranged; and
between the signal pad and the ground pad in the each pad group, only three or less pads of other pad groups are arranged.

13. The semiconductor device according to claim 7, wherein:
the semiconductor chip is a DRAM chip;
the plurality of signal pads comprises a plurality of DQ pads;
the plurality of power pads comprises a plurality of VDDQ pads;
the plurality of ground pads comprises a plurality of VSSQ pads; and
the line of pads further comprises a VDD pad for supplying a power to the semiconductor chip and a VSS pad for supplying a ground to the semiconductor chip.

14. The semiconductor device according to claim 7, wherein:
the substrate comprises at least one pair of complementary signal lines;
the plurality of line group includes a line group which comprises the complementary signal lines, one of the power lines and one of the ground lines and
between the one of the power line and the one of the ground line of the line group the line group which includes the complementary signal lines, the complementary signal lines are arranged right next to each other.

15. The semiconductor device according to claim 7, wherein the plurality of signal terminals, the plurality of power terminals and the plurality of ground terminals are a plurality of solder balls.

16. The semiconductor device according to claim 7, wherein:
the insulator is an insulator tape; and
the plurality of signal lines, the plurality of power lines and the plurality of ground lines are formed on the insulator tape by electrolytic plating.

17. An apparatus comprising a semiconductor device, the semiconductor device comprising:
a substrate provided with an insulator on which a plurality of signal lines, a plurality of power lines related to the plurality of signal lines and a plurality of ground lines related to the plurality of signal lines are disposed in accordance with a predetermined layout, the insulator comprising a first region and a second region, wherein the predetermined layout comprises a plurality of line groups, ones of which are arranged in the first region, while remaining line groups are arranged in the second region, each of the plurality of line groups comprises one of the power lines, one of the ground lines and at least one of the signal line arranged between the one of the power lines and the one of the ground lines, and each of the plurality of line groups shares any one of the power line and the ground line with a neighboring line group of the plurality of line groups;
a semiconductor chip mounted on the substrate and comprises a principal surface and a line of pads disposed on the principal surface between the first region and the second region in accordance with a pad layout defined by the predetermined layout, the line of pads including a plurality of signal pads, a plurality of power pads related to the plurality of signal pads and a plurality of ground pads related to the plurality of signal pads, wherein the plurality of signal pads, the plurality of power pads and the plurality of ground pads are connected with the plurality of signal lines, the plurality of power lines and the plurality of ground lines respectively;
a plurality of signal terminals connected with the plurality of signal lines;
a plurality of power terminals related to the plurality of signal terminals and connected with the plurality of power lines; and
a plurality of ground terminals related to the plurality of signal terminals and connected with the plurality of ground lines.

* * * * *